(12) United States Patent
Rodriguez-Parada et al.

(10) Patent No.: US 8,441,735 B2
(45) Date of Patent: May 14, 2013

(54) OPTICAL ELEMENT HAVING INTERNAL INCLUSIONS CONFIGURED FOR MAXIMUM CONVERSION EFFICIENCY

(75) Inventors: Jose Manuel Rodriguez-Parada, Hockessin, DE (US); Ronald Jack Riegert, Newark, DE (US); Mark E. Lewittes, Wilmington, DE (US); Roger Harquail French, Cleveland Heights, OH (US)

(73) Assignee: E I du Pont de Nemours and Company, Wilmington, DE (US)

( * ) Notice: Subject to any disclaimer, the term of this patent is extended or adjusted under 35 U.S.C. 154(b) by 58 days.

(21) Appl. No.: 13/180,628

(22) Filed: Jul. 12, 2011

(65) Prior Publication Data

US 2012/0229911 A1 Sep. 13, 2012

Related U.S. Application Data

(60) Provisional application No. 61/502,469, filed on Jun. 29, 2011, provisional application No. 61/502,479, filed on Jun. 29, 2011, provisional application No. 61/502,498, filed on Jun. 29, 2011, provisional application No. 61/502,506, filed on Jun. 29, 2011, provisional application No. 61/363,758, filed on Jul. 13, 2010, provisional application No. 61/363,764, filed on Jul. 13, 2010, provisional application No. 61/363,769, filed on Jul. 13, 2010, provisional application No. 61/363,773, filed on Jul. 13, 2010, provisional application No. 61/363,778, filed on Jul. 13, 2010, provisional application No. 61/363,784, filed on Jul. 13, 2010.

(51) Int. Cl.
*G02B 5/00* (2006.01)
*H01L 31/042* (2006.01)
*H01L 31/00* (2006.01)

(52) U.S. Cl.
USPC .......................... 359/642; 136/246; 136/259

(58) Field of Classification Search ... 359/642; 136/246, 136/259
See application file for complete search history.

(56) References Cited

U.S. PATENT DOCUMENTS

| | | | |
|---|---|---|---|
| 4,053,327 A | 10/1977 | Meulenberg, Jr. | |
| 4,379,202 A | 4/1983 | Chalmers | |
| 4,711,972 A | 12/1987 | O'Neill | |
| 5,019,176 A | 5/1991 | Brandhorst, Jr. et al. | |
| 5,076,857 A | 12/1991 | Nowlan | |
| 5,098,482 A | 3/1992 | Warfield | |
| 5,110,370 A | 5/1992 | Vogeli | |
| 5,554,229 A | 9/1996 | Vogeli | |
| 2010/0147375 A1 | 6/2010 | Korech et al. | |

FOREIGN PATENT DOCUMENTS

WO 91/20097 12/1991

*Primary Examiner* — William Choi

(57) ABSTRACT

An optical element comprises a body having opposed planar major surfaces with a plurality of open-mouthed inclusions (grooves) formed on its light output surface. Each groove has a closed apex with an included apex angle. The body is formed from a material having an index of refraction of at least 1.3 and an induced absorbance rate $\Delta Abs/Dose$ less than or equal to about 0.4. The apex angle is selected such that light incident upon the body is conveyed the light output surface by the mechanism of total internal reflection from the boundary walls of the grooves and/or without retro-reflection toward the incident surface.

7 Claims, 7 Drawing Sheets

US 8,441,735 B2

OPTICAL ELEMENT HAVING INTERNAL INCLUSIONS CONFIGURED FOR MAXIMUM CONVERSION EFFICIENCY

CLAIM OF PRIORITY

This application claims priority from each of the following U.S. Provisional Applications, each of which is hereby incorporated by reference:
(1) Optical Element Producing A Modulated Region of Decreased Light Intensity, Application Ser. No. 61/363,758, filed 13 Jul. 2010 (CL-4997);
(2) Optical Element Producing A Modulated Region of Increased Light Intensity, Application Ser. No. 61/363,764, filed 13 Jul. 2010 (CL-5148);
(3) Optically Enhanced Photovoltaic Cell Including An Optical Element Producing A Modulated Region of Decreased Light Intensity, Application Ser. No. 61/363,769, filed 13 Jul. 2010 (CL-5149);
(4) A Display Device Including An Optical Element Producing A Modulated Region of Increased Light Intensity, Application Ser. No. 61/363,773, filed 13 Jul. 2010 (CL-5150);
(5) An LED Lighting Device Including An Optical Element Producing A Modulated Region of Increased Light Intensity, Application Ser. No. 61/363,778, filed 13 Jul. 2010 (CL-5158);
(6) Photovoltaic Apparatus Including An Optical Element Producing A Modulated Region of Light Intensity, Application Ser. No. 61/363,784, filed 13 Jul. 2010 (CL-5159);
(7) Optical Element Having Internal Inclusions Configured For Maximum Conversion Efficiency, Application Ser. No. 61/502,469, filed 29 Jun. 2011 (CL-5294);
(8) Photovoltaic Assembly Including An Optical Element Having Internal Inclusions Configured For Maximum Conversion Efficiency, Application Ser. No. 61/502,479, filed 29 Jun. 2011 (CL-5443);
(9) Optical Element Having Internal Inclusions Configured For Maximum Conversion Efficiency Coated With A Reflective Coating, Application Ser. No. 61/502,498, filed 29 Jun. 2011 (CL-5444); and
(10) Photovoltaic Assembly Including An Optical Element Having Internal Inclusions Configured For Maximum Conversion Efficiency Coated With A Reflective Coating, Application Ser. No. 61/502,506, filed 29 Jun. 2011 (CL-5445).

CROSS-REFERENCE TO RELATED APPLICATIONS

Subject matter disclosed herein is disclosed in the following copending applications, all filed contemporaneously herewith and all assigned to the assignee of the present invention:
Photovoltaic Assemblies Incorporating An Optical Element Having Internal Inclusions Configured For Maximum Conversion Efficiency, application Ser. No. 13/180,638, filed Jul. 13, 2011;
Optical Element Producing A Modulated Region of Decreased Light Intensity and Optically Enhanced Photovoltaic Cell Including The Same, application Ser. No. 13/180,604, filed Jul. 13, 2011;
Optical Element Producing A Modulated Region of Increased Light Intensity and Optically Enhanced Photovoltaic Cell and LED Lighting Device Including The Same, application Ser. No. 13/180,614, filed Jul. 13, 2011; and
Photovoltaic Apparatus Including An Optical Element Producing A Modulated Region of Light Intensity, application Ser. No. 13/180,621, filed Jul. 13, 2011.

BACKGROUND OF THE INVENTION

An active photovoltaic ("PV") solar cell usually has metallic conductor lines on its front, sun-facing, surface. These conductor lines are essential to the operation of the electrical circuit of which the PV solar cell is a part. However, at the same time, these front side metallic conductor lines block a portion of the incident solar radiation from entering the active semiconductor materials in the solar cell. Thus, the obscured radiation is not able to contribute to the photovoltaic current produced by the cell.

The losses in photovoltaic conversion efficiency due to the presence of front side conductor lines are found in many different types of photovoltaic arrangements, from flat panel PV modules to PV modules designed for use at 1 kW/m$^2$ irradiance (approximately the irradiance of the sun at the surface of the earth) to concentrating photovoltaic ("CPV") modules in which the solar radiation is concentrated to 5, 50, or even greater than 500 times the irradiance of the sun and focused on higher efficiency PV solar cells.

Accordingly, it is believed to be advantageous to provide an article in the form of an optical element usable in combination with a photovoltaic solar cell to form a photovoltaic cell assembly in which radiation incident on the optical element is directed away from the front side conductor lines and towards the active semiconductor materials of the PV cell, so that substantially all of the radiation, regardless of incident angle, contributes to the output of the photovoltaic cell assembly and of the module and system of which it is a part.

The radiation durability of such an optical element is also a critical consideration. Radiation durability refers to the ability of a material from which the optical element is made to withstand a predetermined level of irradiance for the desired lifetime of the article. Thus, a flat panel PV module (i.e., a module designed for use at 1 kW/m$^2$ irradiance) must be able to withstand an irradiance of 1 KW/m$^2$ of solar radiation for the desired lifetime (typically twenty-five years) of the PV module and any system in which it is used.

In the case of CPV modules the radiation durability requirements are more stringent since for an identical lifetime the irradiance level is much higher, and the total dose of solar radiation into the materials in concomitantly larger, by a concentration factor.

Accordingly, is it believed to be of further advantage that an optical element that serves to enhance light collection efficiency of a photovoltaic solar cell is, at the same time, also radiation durable for the application and lifetime for which it is used.

SUMMARY OF THE INVENTION

The present invention is directed to an optical element having a body with first and second opposed, substantially planar, major surfaces (i.e., a plano-piano structure). The body is formed from a material having an index of refraction $n_C$ of at least 1.3 and an induced absorbance rate $\Delta Abs/Dose$ less than or equal to about 0.4. More preferably, the index of refraction $n_C$ is in the range 1.33 to 1.75, and, for durability at higher irradiances, an induced absorbance rate $\Delta Abs/Dose$ less than or equal to about 0.2.

Geometrically, the element has a plurality of inclusions in the form of inwardly directed grooves, with each groove having a mouth opening along the light output surface of the body. The mouth has a planar dimension "b". Each groove is defined from opposed, substantially planar boundary walls that extend into the body of the element and terminate at a closed apex having an included apex angle α. The walls of the grooves may be coated with a reflective mirror coating, if desired. The grooves are preferably left open, but, if desired, they may be filled with a material having an index of refraction $n_I$ at least 0.04 lower than the optical element.

The grooves are geometrically configured to exhibit an apex angle α such that the optical element is operative to collect light incident upon its light incident surface at an incident angle β up to a maximum operating angle $\beta_{Max}$ (measured with respect to a normal to the incident surface) and to convey that light to the light output surface without retro-reflection toward the incident surface.

To avoid retro-reflection (for either mirrored or un-mirrored grooves) the apex angle α is defined in accordance with the relationship:

$$\alpha \le \alpha_{Retro} = 60° - \frac{2}{3}\sin^{-1}\left(\frac{\sin\beta_{Max}}{n_C}\right)$$

for any maximum operating angle $\beta_{Max}$ within the range from about $$1° < \beta < 90°.$$

Alternatively, in the case of un-mirrored grooves the geometric configuration of the grooves may be such that light is conveyed to the output surface by employing the mechanism of total internal reflection from the boundary walls of the grooves present within the body of the optical element. In this event the apex angle α is defined in accordance with the relationship:

$$\alpha \le \alpha_{TIR} = 2\cos^{-1}\left(\frac{\sin\beta_{Max}}{n_C}\right) - 2\sin^{-1}\left(\frac{n_I}{n_C}\right)$$

for any maximum operating angle $\beta_{Max}$ chosen from the range:

$$\text{about } 1° < \beta_{Max} < \begin{cases} \sin^{-1}\sqrt{n_C^2 - n_I^2} & \left(\sqrt{n_C^2 - n_I^2} \le 1\right) \\ 90° & \left(\sqrt{n_C^2 - n_I^2} > 1\right). \end{cases}$$

An optical element having un-mirrored grooves may be configured to operate in a way that both avoids retro-reflection and simultaneously utilizes the mechanism of total internal reflection by selecting as the apex angle α the smaller of the angles $\alpha_{Retro}$ or the angle $\alpha_{TIR}$.

A basic photovoltaic assembly may be formed by combining an optical element with a photovoltaic solar cell having an array of conductive lines disposed on its incident surface. Adjacent conductive lines are separated from each other by a pitch dimension "p", with each conductive line having a predetermined line width dimension "g". The light incident surface of the photovoltaic solar cell is attached to the light output surface of an optical element using an adhesive material having a thickness dimension "t". The thickness dimension t of the adhesive is selected such that the adhesive covers each conductive line. The optical element is positioned with respect to the photovoltaic cell such that a conductive line on the light incident surface of the cell lies within a respective groove formed on the light output surface of the optical element.

In another aspect, by judiciously selecting the thickness dimension t of the adhesive layer and by geometrically configuring the groove such that the mouth dimension b lies within the range:

$$g + \frac{2t\sin\beta_{Max}}{\sqrt{n_A^2 - \sin^2\beta_{Max}}} = b_{Min}^0 < b < b_{Max} = p$$

all incoming light that that is not deflected by a reflecting surface of an inclusion ("direct light") will nonetheless avoid impinging on the conductive lines and instead reach the active semiconductor surface, thereby making best use of the light.

Furthermore, configuring the groove such that the mouth dimension b instead lies within the range:

$$g + \frac{2tn_C\sin\left[\sin^{-1}\left(\frac{\sin\beta_{Max}}{n_C}\right) + \alpha\right]}{\sqrt{n_A^2 - n_C^2\sin^2\left[\sin^{-1}\left(\frac{\sin\beta_{Max}}{n_C}\right) + \alpha\right]}} = b_{Min}^1 < b < b_{Max} = p$$

insures that all direct light and as well as all light that is once-deflected by the inclusions within the body of the optical element will be prevented from reaching a conductive line and will instead reach the active semiconductor surface.

In still other aspects, the basic photovoltaic assembly described (comprising an optical element adhesively attached to a photovoltaic solar cell) may be further combined with various additional components to form various photovoltaic module assemblies.

For example, a concentrating photovoltaic module may be fabricated by positioning a light concentrating element in the form of either a lensing element or a mirror a predetermined distance mounting from the light incident surface of the optical element and mounting a heat dissipating arrangement to the photovoltaic cell. If desired, a homogenizer may be disposed on the light incident surface of the optical element.

A flat panel photovoltaic module may be constructed by positioning the basic photovoltaic assembly between a pair of support sheets carried within a frame. A transparent one of the sheets is disposed facing the light incident surface of the optical element.

BRIEF DESCRIPTION OF THE DRAWINGS

The invention may be more fully understood from the following detailed description, taken in connection with the accompanying drawings, which form part of this application and in which.

DETAILED DESCRIPTION OF THE INVENTION

Figure 1:
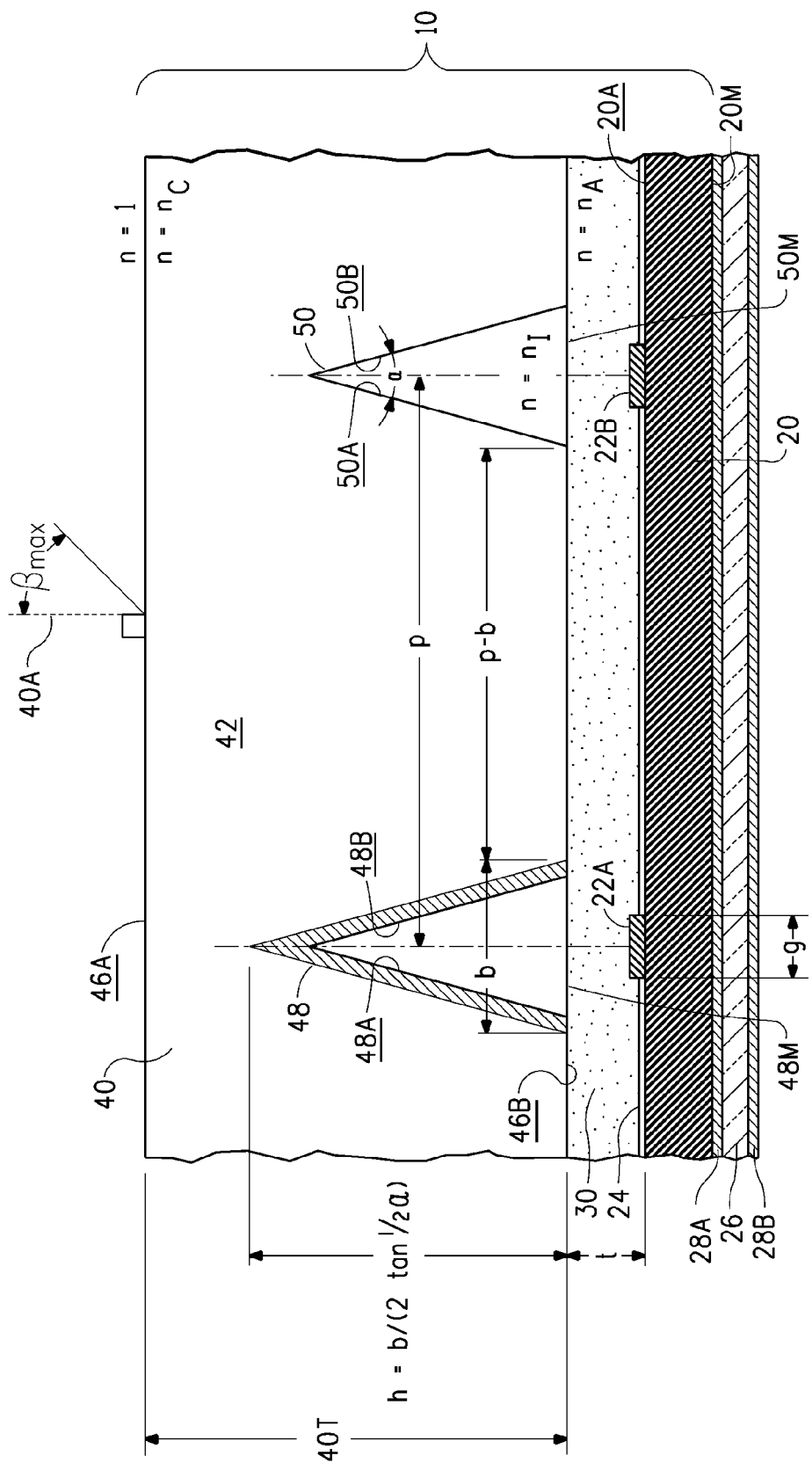
FIG. 1 is a stylized section view of a photovoltaic assembly that comprises an optical element in accordance with the present invention attached through an adhesive layer to the light incident surface of a photovoltaic solar cell.

Throughout the following detailed description similar reference numerals refer to similar elements in all figures of the drawings.

With reference to FIG. 1 shown is a highly stylized pictorial representation of a photovoltaic assembly generally indicated by the reference character 10. The basic photovoltaic assembly 10 of FIG. 1 comprises a photovoltaic solar cell 20 that is attached using an adhesive layer 30 to a plano-piano optical element 40 (sometimes herein referred to as "CLOE") in accordance with the present invention. The scale of the elements 20, 30 and 40 of the photovoltaic assembly is exaggerated for clarity of illustration.

The solar cell 20 comprises a body of semiconducting photovoltaic materials. The cell 20 has a planar light incident surface 20A and an opposed, planar mounting surface 20M thereon. An array of conductive grid lines 22 is disposed in a predetermined pattern over the light incident surface 20A of the cell 20. Two adjacent grid lines 22A, 22B are illustrated in the front section view of FIG. 1. The grid lines 22A, 22B are spaced apart a predetermined substantially uniform pitch distance "p" from each other. Each grid line 22A, 22B is depicted as a substantially rectangular body of conductor material having a predetermined substantially uniform width dimension "g". The light incident surface 20A of the cell 20 may have an anti-reflective coating 24 thereon. The cell 20 is carried on a submount member 26 having a layer 28A, 28B of conductive material (e.g., gold) on the opposed major surfaces of the submount. The submount 26 may be fabricated from a ceramic material or a polyimide film manufactured by E. I. du Pont de Nemours and Company and sold under the trademark KAPTON®.

The optical element 40 itself comprises a body 42 formed of a material having an index of refraction $n_C$. The index of refraction $n_C$ of the body of the optical element lies in the range from about 1.33 to about 1.75. In addition, as will be discussed the material of the element 40 is selected for both its optical properties as well as its radiation durability.

The body 42 may assume any generalized three-dimensional shape so long as it includes first and second substantially planar, opposed major surfaces 46A, 46B, thereby defining a plano-piano optical structure. The major surfaces 46A, 46B are substantially parallel to each other, with the first surface 46A defining a light incident surface and the second surface 46B defining a light output surface. The optical element 40 has a thickness dimension 40T on the order of about five (5) mils.

A reference axis 40A erected perpendicular to the light incident surface 46A is defined to facilitate further discussion. The angle $\beta_{Max}$ designates the maximum angle of light incidence (measured with respect to the reference axis 40A) that is able to harvested and conveyed to the photovoltaic solar cell 20 by the optical element 40 of the present invention.

The body 42 has a plurality of internal inclusions defined therein. The inclusions take the form of grooves, two of which, viz., the grooves 48, 50, are illustrated in FIG. 1. Each groove 48, 50 has a mouth 48M, 50M, respectively, that opens onto and interrupts the light output surface 46B. The mouth of each groove has a predetermined width dimension "b" measured in the plane of the light output surface.

Each groove 48, 50 is formed from pairs of intersecting, substantially planar boundary walls 48A, 48B and 50A, 50B, respectively. The boundary walls of each groove terminate at a closed apex having an included apex angle α. If desired, the boundary walls of the grooves may be coated with a reflective coating. For illustrative purposes only the walls 48A, 48B are illustrated in FIG. 1 with a reflective coating 48R. It should be noted that the thickness of the reflective coating 48R is also exaggerated for clarity in FIG. 1. In practice the presence of the coating 48R does not appreciably increase the magnitude of the mouth dimension b.

Each groove 48, 50 extends into the body 42 for a predetermined distance "h" measured in a direction normal to the light output surface 46B. In terms of the included apex angle α the dimension of the distance h is defined by the relationship:

$$h = b/(2 \tan \alpha/2).$$

In the preferred case the each groove 48, 50 is empty (i.e., contains only air, index of refraction equal to one). In practice it is possible that some adhesive material from the layer 30 may find its way into the grooves. In some instances it may be desired to fill the grooves with a material having an index of refraction $n_i$ that provides a refractive index contrast with the material of the optical element 40. Accordingly, the index of refraction $n_i$ should be lower than the index of refraction $n_c$ of the optical element and exhibit an index difference Δn of at least 0.04.

When the optical element 40 is made of a fluoropolymer with $n_c$ approximately 1.40, a material such as a fluoroelastomer with $n_i$ approximately 1.34 is adequate. Other inclusion materials with similar refractive index and good radiation durability are also suitable.

The adhesive layer 30 provides a bond between the optical element 40 and the light incident surface 20A of the cell 20. The adhesive should be a transparent radiation-durable material with an induced absorbance rate ΔAbs/Dose less than or equal to about 0.4. The adhesive layer has a thickness dimension "t" in the range from about five to about twenty-five (5-25) microns with the thinnest possible dimension being preferred. Ideally the index of refraction $n_A$ of the adhesive 30 should be between that of the material of the optical element 40 and the anti-reflective layer of the PV cell, i.e., in the range from about 1.34 to 1.50, preferably around 1.40. Suitable for use as the adhesive material is RTV615 Silicone available from Momentive Performance Materials, Inc. Any of the materials described in Examples 1 to 11 herein may also be used. In some implementations of the invention it is desirable that the adhesive encapsulates and protects the gridlines.

The optical element 40 can be manufactured by any of the methods know in the art. Typical compression and injection molding techniques are useful methods as well as embossing.

Molds for compression or injection molding or embossing can be made by methods known in the art such as mechanical diamond turning and other microstructure creation methods such as laser patterning of photosensitive materials. In most of these methods a master is created first in a softer material such as copper or a photopolymer, and then it is replicated using nickel electro-deposition techniques well known in the art.

By providing a reflective coating on each side wall of the grooves, the medium inside the groove does not have to have a lower index of refraction for reflecting light. Reflective coatings can be applied by any known techniques such as vacuum metallization in which the coating metal is heated to vaporization in a vacuum chamber and allowed to condense onto the substrate's surface. Resistance heating, electron beam, or plasma heating can be used to vaporize the coating metal. Silver and aluminum are the preferred coating metals. Silver is the most preferred. In order to coat only the walls of the grooves a mask can be used to avoid depositing metal on the other surfaces. However, the entire output surface 46B of the optical element 40 can also be metalized and then the coating on the lands between groves can be removed by abrasion leaving the side walls of the grooves as the only reflecting surfaces.

The basic photovoltaic assembly 10 (comprising an optical element 40 attached via the adhesive layer 30 to the incident surface 20A of the photovoltaic solar cell 20) may be further combined with various additional components to form various photovoltaic module assemblies.

Figure 2:
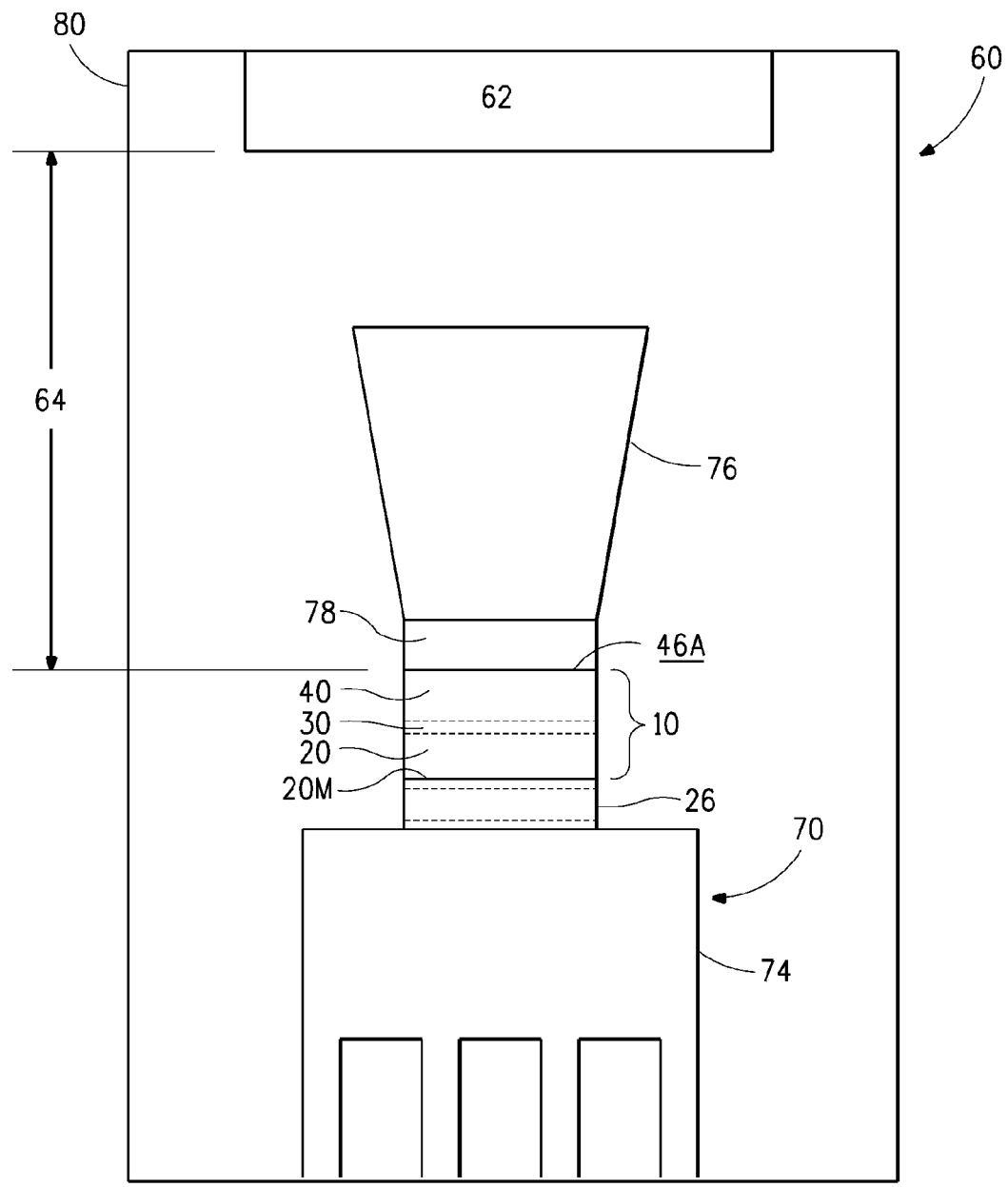
FIG. 2 is a stylized representation of a concentrating photovoltaic module that includes the photovoltaic assembly of FIG. 1.

For example, as illustrated in FIG. 2 a concentrating photovoltaic (CPV) module generally indicated by the reference character 60 for low, medium or high concentration uses may be assembled by positioning a primary light concentrating optical element 62 a predetermined distance 64 (e.g., focal length) from the light incident surface 46A of the optical element 40 of the basic assembly 10. For example, the primary light concentrating element can take the form of a linear or circular Fresnel lens or a mirror.

The submount member 26 may be attached to a heat dissipating arrangement 70 usually in the from of a finned heat exchange element 74. This incorporation enables further integration of these elements and simplify the assembly of the CPV module and increase its performance and effectiveness.

If desired, the light incident surface 46A of the optical element 20 may be attached to a secondary optics arrangement 76 using an adhesive 78. In this instance the plano-piano nature of the optical element 40 is very beneficial. The secondary optics are typically a secondary concentrator to increase the optical concentration above that achieved by the primary optical concentrator, an optical homogenizer which serves to make the optical illumination of the PV cell more uniform, or a combined secondary concentrator/homogenizer. It therefore is possible combine the CLOE with the secondary optic and make a single article that performs both the CLOE and secondary optic functions.

The various components of the CPV module are secured in their described assembled relationship and protected from the environment within a suitable structural housing 80.

A CPV module 60 must be mounted such that it is oriented correctly with respect to the sun. In the case of a medium ("M-CPV") or high concentration ("H-CPV") concentrated photovoltaic system it is also required to have a tracker, which is a motorized system to enable the CPV module to be pointed at the sun as the sun traverses the sky during the day. The tracker can be of a 1-axis motorized type, typical for an M-CPV system, or a 2-axis tracker typically used for a H-CPV system. In addition there are the required inverters to transform DC to AC electricity and their associated wiring and electronics, and mounts or bases to support the trackers and modules.

Figure 3:
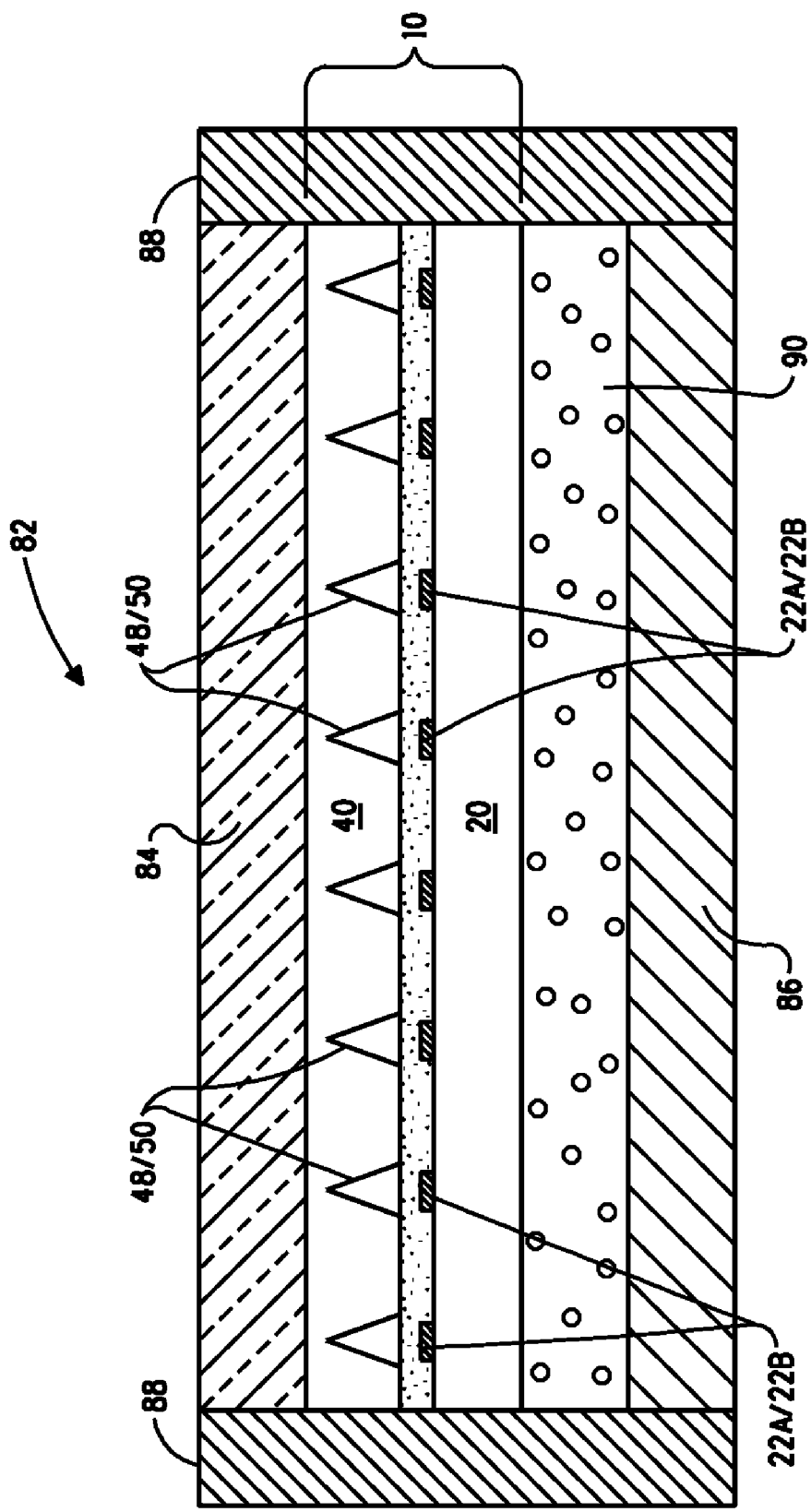
FIG. 3 is a stylized representation of a flat panel PV module that includes a photovoltaic assembly of FIG. 1.

An example of a flat panel photovoltaic module 82 is shown in FIG. 3. In this arrangement the basic photovoltaic assembly 10 may be disposed between a pair of support sheets 84, 86 carried within a peripheral frame 88. The transparent sheet 84 is disposed facing the light incident surface 46A of the optical element 40. A suitable encapsulant material 90 may also be included within the module 82 and disposed between one (or both) of the support sheet(s).

In accordance with the present invention, given the various physical dimensions "g", "p", "t" and the various material properties $n_C$, $n_A$ and $n_I$ (if a material other than air is present within the grooves), the apex angle $\alpha$ and the mouth dimension "b" of the optical element 40 are chosen to maximize the amount of light incident on the surface 46A with the range of incident angles (up to a maximum desired angular extent angle $\beta_{Max}$) that is conveyed to the open surface area of the photovoltaic solar cell 20.

Figure 4:
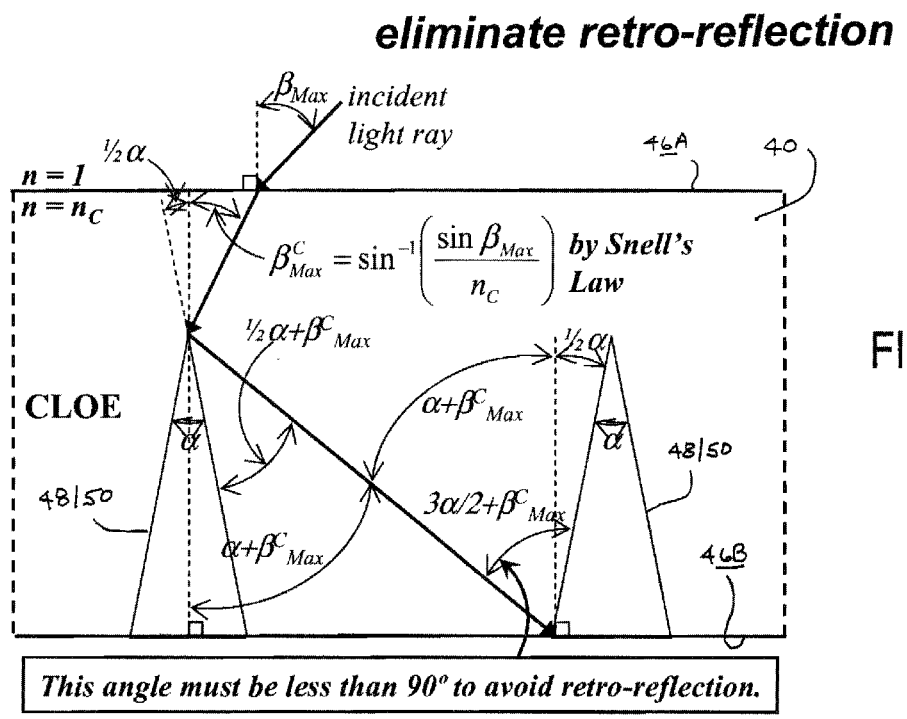
FIG. 4 is a definitional drawing illustrating an optical element geometrically configured in accordance with the present invention to avoid retro-reflection of light conveyed through the optical element.

In particular, the value of the apex angle $\alpha$ is chosen such that light having an incident angle less than the maximum desired incident angle $\beta_{Max}$ is conveyed through the optical element 40 without the occurrence of retro-reflection toward the incident surface. As seen from the diagram shown in FIG. 4, regardless of whether the element 40 has mirrored grooves 48 or un-mirrored grooves 50, retro-reflection is prevented so long as the apex angle $\alpha$ of the groove 48/50 is defined in accordance with the relationship:

$$\alpha < \alpha_{Retro} = 60° - \frac{2}{3}\sin^{-1}\left(\frac{\sin\beta_{Max}}{n_C}\right)$$

for any maximum operating angle $\delta_{Max}$ within the range about $1° < \beta_{Max} < 90°$.

It is noted that $\pi/3$ radians has an angular value of sixty degrees (60°).

Figure 5:
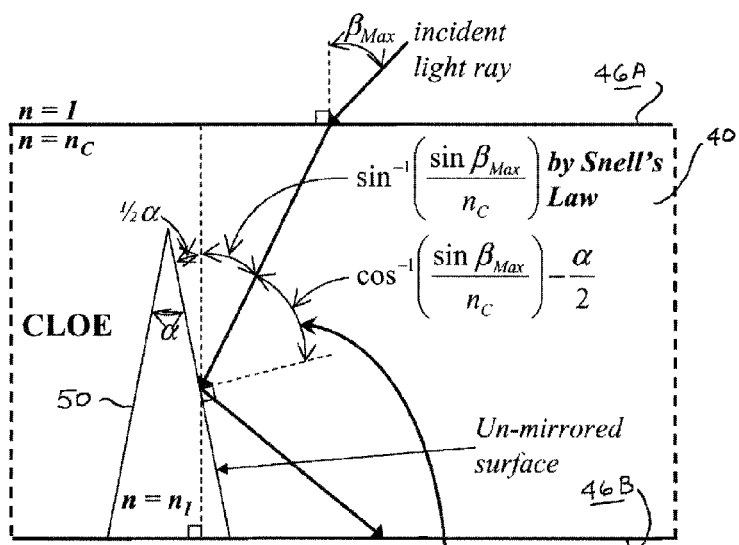
FIG. 5 is a definitional drawing illustrating an un-mirrored optical element geometrically configured in accordance with the present invention to convey light through using the mechanism of total internal reflection.

In addition, as presented in the diagram shown in FIG. 5, for the case of an optical element 40 having un-mirrored grooves 50 (i.e., no reflective coating on the boundary walls) light is conveyed to the light output surface 46B by the mechanism of total internal reflection from the boundary walls of the grooves 50 present within the body of the optical element. To utilize the mechanism of total internal reflection the apex angle $\alpha$ of the grooves 50 is defined in accordance with the relationship:

$$\alpha \leq \alpha_{TIR} = 2\cos^{-1}\left(\frac{\sin\beta_{Max}}{n_C}\right) - 2\sin^{-1}\left(\frac{n_I}{n_C}\right)$$

for any maximum operating angle $\beta_{Max}$ chosen from the range $$\text{about } 1° < \beta_{Max} < \begin{cases} \sin^{-1}\sqrt{n_C^2 - n_I^2} & \left(\sqrt{n_C^2 - n_I^2} \leq 1\right) \\ 90° & \left(\sqrt{n_C^2 - n_I^2} > 1\right) \end{cases}.$$

Both effects (i.e., no retro-reflection and the mechanism of total internal reflection) may be obtained for an un-mirrored optical element if the smaller value of the apex angle is selected.

In another aspect, the optical element may be geometrically configured in such a way that all incoming light that fails to impinge on a reflecting surface of a groove (i.e., direct light) will nonetheless avoid impinging on the conductive lines and instead reach the active semiconductor surface. In addition, the configuration of the optical element may be arranged in such a way that insures that all direct light and as well as all light that is once-deflected by the inclusions within the body of the optical element will be prevented from reaching a conductive line and will instead reach the active semiconductor surface.

Figure 6:
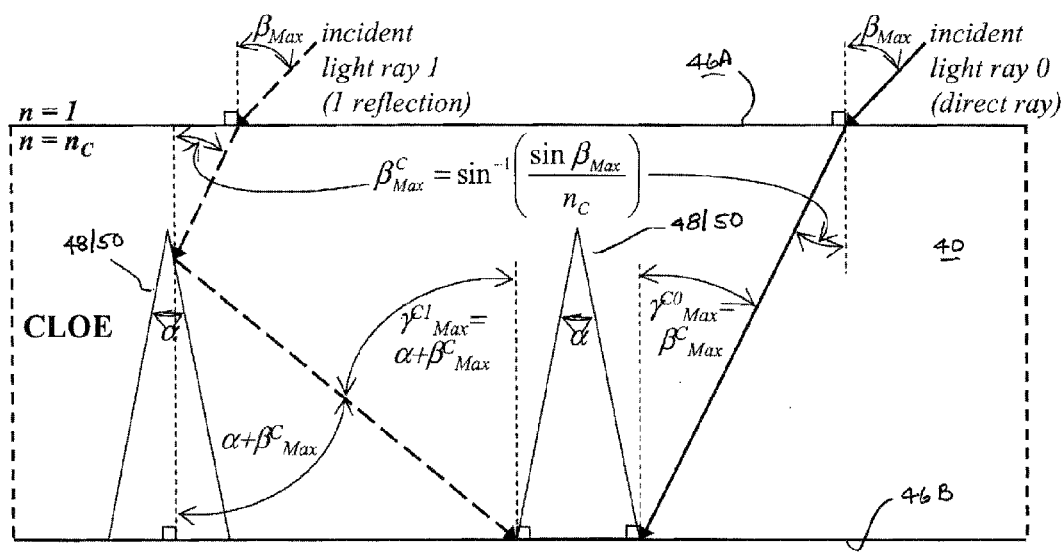
FIG. 6 is a definitional drawing geometrically defining direct and once-deflected light conveyed through an optical element.

FIG. 6 is a definitional diagram that defines the exit angle $\gamma_C$ for the case of both direct and once-deflected light rays leaving the output surface 46A and entering the adhesive layer 30.

Figure 7:
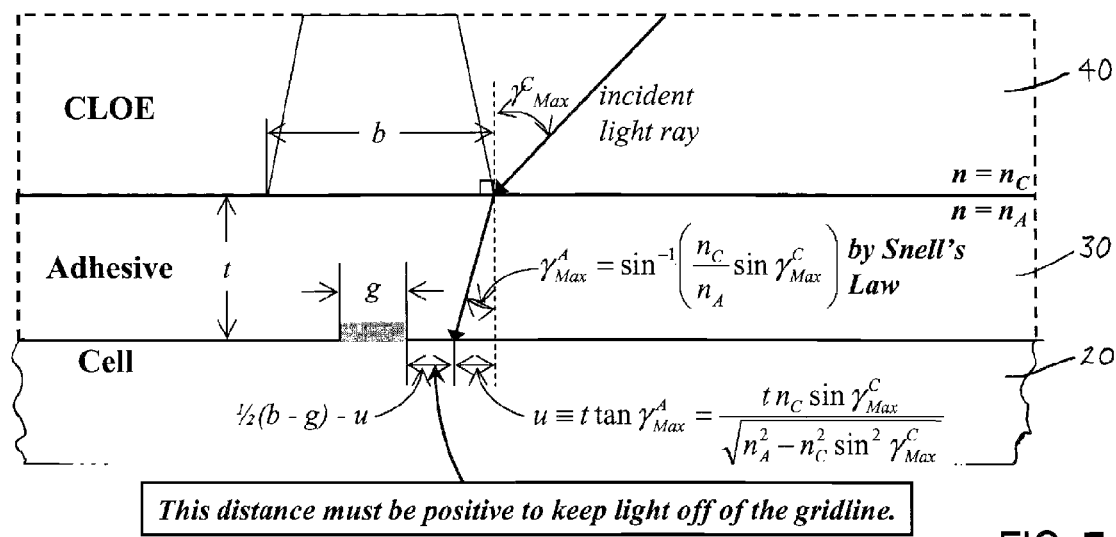
FIG. 7 is a definitional drawing illustrating an optical element geometrically configured in accordance with the present invention such that the mouth opening of an inclusion is sized to prevent grid line illumination by boy direct and once-deflected light.

As is apparent from FIG. 7, by judiciously selecting the thickness dimension t of the adhesive layer 30 and by configuring the grooves such that the mouth dimension b lies within the range defined by the relationship:

$$g + \frac{2t\sin\beta_{Max}}{\sqrt{n_A^2 - \sin^2\beta_{Max}}} = b_{Min}^0 < b < b_{Max} = p$$

all of the direct light propagating through the optical element 40 avoids falling on a grid line 22A.

Furthermore, configuring the groove such that the mouth dimension b also lies within the range:

$$g + \frac{2tn_C\sin\left[\sin^{-1}\left(\frac{\sin\beta_{Max}}{n_C}\right) + \alpha\right]}{\sqrt{n_A^2 - n_C^2\sin^2\left[\sin^{-1}\left(\frac{\sin\beta_{Max}}{n_C}\right) + \alpha\right]}} = b_{Min}^1 < b < b_{Max} = p$$

insures that once-deflected light does not impinge upon a grid line.

The body is formed from a material having an index of refraction $n_C$ of at least 1.3 and an induced absorbance rate $\Delta Abs/Dose$ less than or equal to about 0.4, and more preferably, less than or equal to about 0.2

When looking at the CPV applications, where long lifetimes at 5, 50 or 500 kW/m² irradiances are desired, the total dose of solar radiation delivered to the sample can become extremely high. For example in one year, with AM1.5D solar radiation, a flat panel (1 kW/m²) application will have a solar radiation dose of approximately 9.3 GJ/m²/yr in certain locations while at 50 Suns the total solar radiation dose would be approximately 465.0 GJ/m²/yr, and at 1500 kW/m² irradiance the total solar radiation dose would be approximately 1395 GJ/m²/yr at the same locations. The radiation durability of a material may not be linear in dose, and may be strongly affected by irradiance levels and environmental factors such as oxygen or moisture. It is apparent that experimental knowledge of the radiation durability is essential in materials selection for long lifetime. Data at approximately 3.8 kW/m² and 52 kW/m² irradiance, which permits the determination of the induced absorbance rate in materials that can be selected for use in a CLOE is very important to the materials selection decisions. The important radiation durability and lifetime considerations are that the Irradiance times the desired lifetime represents the total solar radiation dose that will be imposed on the materials during their lifetime. The induced absorbance rate, which corresponds to the highest rate of the increase in the optical absorbance of the material, at some wavelength, represents photochemical darkening events in the material. This induced absorbance rate times the total dose expected over the CLOE's lifetime therefore gives one an estimate of the total induced absorbance which is added to the initial optical absorbance of the material prior to its use in solar radiation. When the total optical absorbance of the material becomes too large, the CLOE is degraded.

In accordance with the invention materials having an induced absorbance rate $\Delta Abs/Dose$ less than or equal to about 0.4 are preferred. More preferred are materials that have an induced absorbance rate $\Delta Abs/Dose$ less than or equal to 0.2. The more preferred materials are identified with underlined values in the Table 1 "Induced Absorbance Rates of Materials Tested in Air at Solar Irradiances Of Approximately 4 And 50 KW/m²" that follows herein.

It should be noted that the presence of oxygen around a material can increase its induced absorbance rate. In the mentioned Table the induced absorbance rates are for materials tested in air. Accordingly, various listed materials are inoperative when used in an air environment (>=0.4). These inoperative (in air) materials are indicated by an asterisk ("*") in the Table.

However, when these same materials are used for a flat panel PV application, due to the encapsulation, these materials would exhibit a lower induced absorbance rate. Therefore, various materials identified in the table as an inoperative in air could be operative in a flat panel PV application.

Radiation Durability Methods & Results

Solar Radiation Exposure Method

The following describes the solar simulated irradiation durability set up and procedures used to expose materials to simulated solar light to enable the evaluation of the effect of full spectrum simulated solar radiation on materials.

To simulate solar radiation exposure of samples used were a Newport Corporation, (Corporate Headquarters, 1791 Deere Avenue, Irvine Calif. 92606), Solar Simulator, (Model #92190-100), with a Newport Power Supply, (Model #69922), that sends a programmed power output to a Newport Digital Exposure Control unit, (Model #68945), that was coupled with a fiber optic feed back sensor, located at the beam exit, to digitally control the light flux. This permitted the solar simulator to operate in a programmed control range that delivered a constant irradiance to the samples over the duration of the test.

The Newport Solar Simulator used a 1600 watt Xenon lamp in combination with integrated internal optics, including AM 0 and AM1.5 optical filters, to deliver a diverging beam of simulated solar spectral irradiance to the sample area. To measure the power output, at the sample level a Newport Power Meter, (Model#1918-C), connected to a Newport thermopile detector, (Model#818-250-25), located in the optical beam path, was used.

Radiation durability testing was done at uniform irradiance of approximately 3.8 KW/m². This was at a working distance of 8.3 cm from the exit window of the simulator in an exposure area of 15×15 cm. This working area allowed for the simultaneous testing of multiple samples. Typical sample size was 2.5×4 cm; sample thickness varied from 0.025 to 2.5 mm. The total exposure dose in GJ/m² was calculated from the irradiance in kW/m² times the exposure time. The beam irradiance was measured using a Newport 25 watt thermopile type detector, (Model #(818-25-12)). During irradiation exposures, temperature and relative humidity were not controlled, they are typical of an air conditioned laboratory. Sample temperature rose from room temperature to typically 50° C. as samples were exposed to the simulated solar light.

Radiation Durability was also done at uniform irradiances of 48 kW/m² by adding a Newport 13X concentrator lens assembly, (Model #SP81030-DIV) to the exit window of the Newport Solar Simulator. The assembly mounted onto the diverging solar simulator producing a 2.5×2.5 cm working area at a distance of 8.5 cm from the final condensing lens which enabled testing samples up to 2.5×0.5 cm in size. This beam irradiance was measured by using a Newport 250 watt fan cooled thermopile type detector, (Model #818-250-25), with a 0.6×0.6 cm aperture plate attached. Also, during irradiation, temperature and relative humidity are not controlled but are typical of an air conditioned laboratory. Sample temperature rises from room temperature to typically 50° C. as samples are exposed to the simulated solar light.

Center Mount Absorbance Method

The optical absorbance of free standing films and films on high purity fused silica substrates was determined by the center mount absorbance method over the entire 200-2500 nm wavelength range using a Varian Cary 5000 UV-Vis-NIR spectrophotometer with an accessory integrating sphere (Varian DRA-2500). A clip-style variable angle center mount sample holder is used for the absorbance measurement for films and film on glass translucent samples. The measured value of absorbance was divided by the film thickness to obtain a value of optical absorbance per cm (base 10).

$$A/cm = (-\log T_{film})/t \quad (1)$$

$$A/cm = \frac{\log_{10}[T_{substrate}/T_{film}]}{t_{film}} \quad (2)$$

where A is the base 10 optical absorbance per cm, T is the transmission of film, and t is the thickness of film (cm).

The calculation of optical absorbance assumed that the free standing film was of homogenous composition and uniform thickness. For film on glass samples, the calculation of optical absorbance assumed that the transmission (T) of the glass substrate is 1. Transmission based measurements also required that the film thickness of the sample on the substrate be optimized for the dynamic range of the technique so that the transmittance of the film falls in the range from 3 to 90%. If the transmittance falls much below 1%, the accuracy of the measurement was severely degraded, and erroneous results appear.

The center mount measurement was conducted under the following conditions: The external DRA-2500 was installed into the spectrophotometer and aligned. UV-Vis-NIR spectra were, in general, acquired in the region of 200-2500 nm using appropriate baseline correction (zero/baseline for % T and absorbance correction for spectral only). Indicative instrumental parameters were as follows: spectral bandwidth (SBW): 4 nm (UV/Vis), 16 nm (NIR); averaging time: 0.4 sec; data interval: 2 nm; double beam mode using full slit height for % T and absorbance, a small spot kit (SSK) was used for the center mount absorbance data.

As in all experimental measurements, the accuracy of the measured values was a function of the sample and measurement apparatus. The inherent sensitivity of spectral transmission and absorbance measurements is affected by the optical path length of the sample, and the transmission drop that occurs as light transmits through the sample. As the transmission decreased, the accuracy of absorbance measurement decreased. A transmission difference of ~0.1% is near the limit of the measurement method.

Induced Absorbance Rate: Average ΔAbs/cm per GJ/m² Dose Calculation

The induced absorbance rate, or Average ΔAbs/cm per GJ/m² Dose, was calculated by $$\text{Average } \frac{Abs}{cm} \text{per} \frac{Gj}{m^2} \text{Dose} = \frac{Abs_f(\lambda)/cm - Abs_i(\lambda)/cm}{Dose_{total}} \quad \text{Equation (3)}$$

where $Abs_f$ is the finial spectral optical absorbance, $Abs_i$ is the initial spectral optical absorbance and $Dose_{total}$ is the total dose of the sample received.

It is important to develop a useful metric of photochemical processes such as photobleaching or photodarkening in testing CPV materials. One desirable radiation durability metric is the change in the spectral optical absorbance (ΔAbs/cm (λ)) for an average of full spectrum solar radiation dose (in GJ/m²) since this allows us to observe and study the sources of photochemical changes which arise over the exposure time. This is called the average ΔAbs/cm per GJ/m² dose (or induced absorbance rate), and this metric allows tracking of the rates of photochemical processes including photochemical bleaching and darkening of both intrinsic and extrinsic components of the material and is scaled in units of 1 GJ/m² dose.

Combining insights derived from the Induced Absorbance Rate, with experiments run at different irradiance levels (such as 3.8 kW/m² and 48.2 kW/m²), will help to define the best material sets and understand the mechanisms which are related to the lifetime improvement.

The Average ΔAbs/cm per GJ/m² Dose was measured as a function of wavelength and in the table report the value of this induced absorbance rate for a particular wavelength where it is the largest positive value observed at a particular irradiance. Positive values of the induced absorbance rate correspond to Photodarkening, i.e. increasing optical absorbance, whereas negative values of the induced absorbance rate correspond to Photobleaching. The induced absorbance rate was used as indicative of solar radiation induced photodegradation of the material, which limits the useful lifetime of the material in the optical element due to the continuing increase in the material's optical absorbance.

TABLE 1

Induced Absorbance Rates of Materials Tested in Air at Solar Irradiances Of Approximately 4 And 50 KW/m²

| Material | 4 Sun Irradiance (kW/m²) | 4 Sun Total Dose (GJ/m²) | 4 Sun ΔAbs/Dose (Abs/cm/(GJ/m²)) | 4 Sun At λ (nm) | 50 Sun Irradiance (kW/m²) | 50 SunTotal Dose (GJ/m²) | 50 Sun ΔAbs/Dose (Abs/cm/(GJ/m²)) | 50 Sun At λ (nm) |
|---|---|---|---|---|---|---|---|---|
| Teflon PFA (5 mil) | — | | | | 52.0 | 158.0 | 0.008 | 222 |
| Teflon ® FEP 200A | 3.8 | 42.4 | 0 | | | | — | |
| Teflon ® FEP 500A | 3.8 | 42.4 | 0 | | 52.0 | 158.0 | 0.014 | 222 |
| Teflon ® ETFE 200LZ | 3.8 | 42.4 | 0 | | | | — | |
| Teflon ® ETFE | 3.8 | 42.4 | 0 | | 52.0 | 158.0 | 0 | |

TABLE 1-continued

Induced Absorbance Rates of Materials Tested in Air at Solar Irradiances Of Approximately 4 And 50 KW/m$^2$

| Material | 4 Sun Irradiance (kW/m$^2$) | 4 Sun Total Dose (GJ/m$^2$) | 4 Sun ΔAbs/Dose (Abs/cm/(GJ/m$^2$)) | 4 Sun At λ (nm) | 50 Sun Irradiance (kW/m$^2$) | 50 SunTotal Dose (GJ/m$^2$) | 50 Sun ΔAbs/Dose (Abs/cm/(GJ/m$^2$)) | 50 Sun At λ (nm) |
|---|---|---|---|---|---|---|---|---|
| 500LZ Example 2 | 3.8 | 37.4 | 0.076 | 304 | 52.0 | 158.0 | 0.021 | 308 |
| Example 1 | 3.8 | 37.4 | 0 | | 52.0 | 158.0 | 0.175 | 234 |
| Example 11 | 3.8 | 37.4 | 0 | | 52.0 | 158.0 | 0 | |
| Tedlar ® TUT20BG3 | 3.8 | 37.4 | 0 | | | | — | |
| Tedlar ® TR10AH9 | 3.7 | 27.4 | 0 | | 51.7 | 79.8 | 0.013 | 312 |
| Silicone XE14-C1063 | 3.8 | 37.4 | 0.033 | 237 | 52.0 | 78.2 | 0.055 | 230 |
| Melinex XST 6578 | 3.7 | 27.4 | 0.085 | 396 | | | — | |
| RTV615 Silicone | 3.8 | 37.4 | 0.172 | 220 | 52.0 | 158.0 | 0.021 | 228 |
| DuPont ™ PV 5200 (PVB)* | 3.9 | 29.8 | 0.474 | 266 | | | — | |
| Korad ® Film 05005* | 3.8 | 37.4 | 0.491 | 244 | | | — | |
| DuPont ™ Elvax ® PV1400* | 3.8 | 32.4 | 0.807 | 242 | | | — | |
| DuPont ™ PV 5300* | 3.8 | 26.9 | 1.098 | 266 | | | — | |
| Melinex ® ST504* | 3.7 | 27.4 | 1.72 | 332 | | | — | |
| Mylar ® 200DM* | 4.1 | 10.0 | 6.78 | 328 | 52.0 | 34.1 | 6.39 | 336 |

*Inoperative for use in an oxygen containing environment

Synthesis of Non-Commercial Materials

Example 1

Preparation and Photocrosslinking of Poly(EVE/TFE)

A 1 liter autoclave was loaded with 200 ml of EVE, heated to 30° C. with stirring, pressured with 100 psi N$_2$, and vented three times. The autoclave was then pressured to 30 psi with TFE and vented, four times. The autoclave was pressured to 50 psi with TFE. Using a chilled line, 0.2 ml of ~0.2 M DP in Vertrel XF was injected. After stirring for 1 hr at ambient temperature, additional 0.2 M DP was injected at a rate of ~0.01 ml/min until 15 g of TFE had been adsorbed, while holding TFE pressure constant at 50 psi. A total of 6.72 ml of DP was injected over 623 min. The product mixture was recovered as a hazy fluid, with the consistency of motor oil. Excess EVE was distilled off under vacuum, eventually bringing the heating mantle 157° C. while pulling a vacuum of ~520 mm. This gave 40.2 g of slightly tacky gum. The gum had a Tg of −30° C. (DSC, 10° C./min, N$_2$, second heat). NMR analysis found the polymer to be 34.4 mole % EVE and 65.6 mole % tetrafluoroethylene. A 0.1 g sample of residue readily dissolved in 1 g of hexafluorobenzene, making a clear solution with a few undissolved particulates. Inherent viscosity in hexafluorobenzene was 0.07 dL/g.

After 68 hr of exposure 1 "under a Rayonet Photochemical Reactor bulb, a sample of poly(EVE/TFE) turned from a soft gum to a brittle film. Rolling a 0.0335 g piece of film with 0.5 g of hexafluorobenzene for 3 hr caused the film to gain 11% in weight. A curled piece of film maintained its shape for 2 hr in a 225° C. oven, a major change from the soft, gummy starting polymer prior to UV exposure. Exposure for 60 min at 11.5 millwatts/cm$^2$ UV intensity made a sample of poly(EVE/TFE) smooth to the touch. The polymer sprang back when indented with a fingernail and formed a gel when mixed with hexafluorobenzene.

The index of refraction at D-line was 1.34 and the induced absorbance rate was less than or equal to 0 Abs/cm/(GJ/m$^2$)) at 3.8 kW/m$^2$ and was 0.175 at a wavelength of 234 nm at an irradiance of 52 kW/m$^2$.

Example 2

Preparation and Photocrosslinking of Poly(TFE/PMVE/PEVE/8-SAVE)

A 1 liter autoclave was charged with 450 ml of distilled water, 0.8 g of ammonium persulfate, 3 g of C$_8$F$_{17}$COONH$_4$, and 20 g of CF$_2$=CFOCF$_2$CF(CF$_3$)OCF$_2$CF$_2$SO$_2$N$_3$ (8-SAVE). The autoclave was sealed, evacuated and further loaded with 36 g of CF$_2$=CFOCF$_2$CF$_3$ (PEVE), 83 g CF$_2$=CFOCF$_3$ (PMVE), and 45 g of CF$_2$=CF$_2$ (TFE). The autoclave was heated slowly to 70° C., and then stirred for 8 hr at 70° C., while maintaining pressure from about 230-250 psi by the periodic addition of TFE:PMVE:PEVE in a roughly 1 g to 0.4 g to 0.25 g ratio. This gave an opalescent blue emulsion, with a small mass of precipitated polymer on top. The precipitated polymer was removed by filtering through cheesecloth packed in the neck of a filter funnel, giving 742 g of filtrate.

About 670 g of this filtrate were frozen and thawed. The resulting damp mass was broken into two batches, with each batch being washed in a Waring blender twice with 1000 ml of water, twice with 600 ml of methanol, and twice with 750 ml of acetone. Sucking the washed product dry in a Buchner filter gave springy, elastic cakes, 166 g from the first batch and 112 grams from the second batch.

The polymer analyzed for 66.6 mole % TFE, 22.8 mole % PMVE, 9.2 mole % PEVE, and 1.4 mole % 8-SAVE by $^{19}$F NMR. The polymer had a Tg of 6.5° C. (DSC, 10° C./min, N$_2$, second heat).

Rolling a 0.1 g sample of poly(TFE/PMVE/PEVE/8-SAVE) with 3 ml of Novec HFE-7500 gave a hazy solution, which was spotted on a glass microscope slide and air-dried to a colorless film. The microscope slide, while in a quartz box under N$_2$, was irradiated for 17 hr with a Rayonet Photochemical Reactor bulb. The irradiated poly(TFE/PMVE/PEVE/8-SAVE) did not redissolve in Novec HFE-7500.

The index of refraction at D-line was 1.33 and the induced absorbance rate was 0.076 Abs/cm/(GJ/m$^2$)) at 3.8 kW/m$^2$ and was 0.021 at a wavelength of 308 nm at an irradiance of 52 kW/m$^2$.

Example 3

Preparation and Photocrosslinking of Poly(EVE/E)

A 210 ml autoclave was chilled to about −20° C. and 42 ml of EVE and 10 ml of ~0.19 M DP initiator in Vertrel XF were added. The autoclave was evacuated and 3 g of ethylene were added. While shaking overnight, the pressure inside the autoclave reached a maximum of 84 psi at 20° C. after 45 min and decreased to 18 psi at 26.5° C. at the end of the run 921 min later. The resulting hazy fluid was transferred to a Teflon®—lined tray and allowed to evaporate first at ambient and then overnight in a 75° C. oven, at which point the clear, tacky residue weighed 22.4 g. The residue still weighed 22.4 g after another 24 hr in the 75° C. oven. The gum had a Tg of −36° C. (DSC, 10° C./min, $N_2$, second heat). Combustion analysis found 29.92% C and 1.64% H, versus 29.70% C and 1.65% H calculated for a polymer that is 47.6 mole % EVE and 52.4 mole % ethylene. A 0.1 g sample of residue readily dissolved in 1 ml of 2-heptanone, making a clear solution.

Exposure of a sample of poly(EVE/E) to 0.2 milliwatts/$cm^2$ UV intensity transformed it from a tacky glue-like material that was readily soluble in 2-heptanone to a non-tacky, modestly elastomeric polymer that swelled but did not dissolve in 2-heptanone. Exposure for 60 min at 11.5 milliwatts/$cm^2$ UV intensity made the polymer silky smooth to the touch. The polymer sprang back when indented with a fingernail and formed a gel when mixed with 2-heptanone.

Example 4

Preparation and Photocrosslinking of Poly(EVE/VF2)

A 240 ml autoclave was chilled to about −20° C., and 42.2 ml of EVE dissolved in 20 ml of Vertrel XF and 25 ml of ~0.05 M DP initiator in Vertrel XF were added. The autoclave was evacuated and 13 g of vinylidene fluoride was added. Shaking overnight, the pressure inside the autoclave reached a maximum of 103 psi at 24° C. after 70 min and decreased to 5 psi at 25.4° C. at the end of the run 1090 min later. This gave a viscous, clear, water-white solution. Drying a 0.9637 g sample of this solution, first under a flow of nitrogen, and then overnight in a 75° C. oven gave 0.6703 g of tacky gum.

After exposure for 60 min at 11.5 milliwatts/$cm^2$ UV intensity, a sample of poly(EVE/VF2) had no tack, sprang back when indented with a fingernail, and formed a gel when mixed with 2-heptanone.

Example 5

Preparation and Photocrosslinking of Poly(EVE/TFE/PDD)

A 210 ml autoclave was chilled to about −20° C., and 4 g of EVE dissolved in 50 ml of Vertrel XF, 14.2 ml of PDD, and 10 ml of ~0.17 M DP initiator in Vertrel XF were added. The autoclave was evacuated and 10 g of tetrafluoroethylene was added. Shaking overnight, the pressure inside the autoclave reached a maximum of 57 psi at 33.6° C. after 66 min, and decreased to 17 psi at 33.3° C. at the end of the run 990 min later. This gave a highly viscous solution that barely flowed. Drying under a $N_2$ flow for 43 hr under pump vacuum, and for 24 hr in a 75-52° C. vacuum oven, gave 32.55 g of polymer that had an inherent viscosity of 0.370 dL/g in hexafluorobenzene. Composition by fluorine NMR was 1.2 mole % EVE, 53.7 mole % TFE, and 45.1 mole % PDD.

After exposure under a 1 kW deep UV short arc lithographic lamp for 60 min, a sample of poly(EVE/TFE/PDD) was found to have no tack, to be still stiffer, and to form a gel that retained the shape of the starting film when mixed with Fluorinert FC-40.

Example 6

Preparation and Photocrosslinking of Poly(EVE/PDD)

A small sample vial equipped with serum cap and magnetic stir bar was loaded with 1 ml of PDD and 2 ml of EVE. The vial was flushed with $N_2$, and 1 ml of ~0.17M DP in Vertrel XF was injected. Three days later, a second ml of ~0.17M DP was injected. On the sixth day, the reaction mixture was added to ~30 ml of methanol. The resulting precipitate was filtered, sucked dry in the filter, and further dried for 16 hr under pump vacuum to give 0.71 g of product. Combustion analysis found 24.88% C, versus 25.24% C calculated for 1:1 poly(EVE: PDD).

After a sample of poly(EVE/PDD) was irradiated overnight at about 0.2 milliwatts/$cm^2$ UV intensity, it was no longer soluble in perfluorooctane.

Example 7

Preparation and Photocrosslinking of Poly(EVE/TFE/PPVE)

A 400 ml autoclave was chilled to about −20° C., and 10 g of EVE dissolved in 100 ml of Vertrel XF, and 10 ml of ~0.2 M DP initiator in Vertrel XF were added. The autoclave was evacuated, and 50 g of tetrafluoroethylene was added. Shaking overnight, the pressure inside the autoclave reached a maximum of 84 psi at 6.5° C. after 22 min, and decreased to 0 psi at 20.9° C. at the end of the run 1043 min later. The damp white solid was transferred to a vacuum filter, rinsed in the filter with Vertrel XF, sucked dry in the filter, and further dried overnight in a 130° C. vacuum oven, giving 53.2 g of product.

A 1 g sample of poly(EVE/TFE/PPVE) was placed between two Kapton® sheets and heated for ten min between the platens of a 320° C. press before applying a force of 20,000 pounds for 22 min. This gave a hazy film ~3" in diameter and 4 to 5 mils thick. The film was cut in half and one half placed in a quartz box under $N_2$ where it was irradiated for about 65 hr at about 0.2 milliwatts/$cm^2$ UV intensity. Dynamic mechanical analysis of the exposed and unexposed halves of the polymer film at 245° C. found the exposed half of the film to be stiffer, with a higher modulus (34 MPa) than the unexposed half of the film (22 MPa).

Example 8

Preparation and Photocrosslinking of Poly(8-CNVE/PDD/TFE)

An autoclave was chilled to about −20° C., and 4 g of 8-CNVE dissolved in 20 ml of Vertrel XF, 14.2 ml of PDD, and 5 ml of ~0.17 M DP initiator in Vertrel XF were added. The autoclave was evacuated, and 7 g of tetrafluoroethylene were added. Shaking overnight, the pressure inside the autoclave reached a maximum of 110 psi at 17.3° C. after 59 min, and decreased to 49 psi at 34.1° C. at the end of the run, 1000 min later. This gave a colorless gel. Drying under a $N_2$ flow and then for 43 hr under pump vacuum gave 27.8 g of polymer that had an inherent viscosity of 0.476 dL/g in hexafluorobenzene. $^{19}$F NMR was consistent with a polymer composition of 2.3 mole % 8-CNVE, 42.3 mole % TFE, and 53.4 mole % PDD; 2 mole % of unreacted 8-CNVE monomer was also detected. Tg was 106° C. (second heat, 10° C./min, N$_2$). The polymer made viscous, clear solutions when dissolved at 0.1 g/1 g hexafluorobenzene and 0.1 g/2 g of Fluorinert FC-40.

Rolling a 0.1 g sample of poly(8-CNVE/PDD/TFE) with 1 g of Fluorinert FC-40 gave an extremely viscous solution which was spotted on a glass microscope slide and air-dried to a film. The microscope slide, while in a quartz box under N$_2$, was irradiated for 71.5 hr with about ~0.2 milliwatts/cm$^2$ UV intensity. The recovered film sample of poly(8-CNVE/PDD/TFE) gave a swollen gel in Fluorinert FC-40.

Example 9

Preparation and Photocrosslinking of Poly(8-CNVE/EVEOCN/PDD)

A small sample vial equipped with serum cap and magnetic stir bar was loaded with 2 ml 8-CNVE, 0.2 ml EVEOCN, and 1 ml of PDD while chilling on dry ice. The vial was flushed with N$_2$, and 0.5 ml of ~0.2 M DP in Vertrel XF was injected. The vial was allowed to warm to room temperature with magnetic stirring. The next morning, a second 0.05 ml of ~0.17M DP was injected. On the following day, the viscous reaction mixture was blown down with N$_2$, giving 4.1 g of white solid that had an inherent viscosity of 0.108 dL/g in Novec HFE-7500. $^{19}$F NMR was consistent with a polymer composition of 22.2 mole % 8-CNVE, 4.4 mole % EVEOCN, and 63.4 mole % PDD; 7.6 mole % of unreacted 8-CNVE monomer and 2.4 mole % of unreacted EVEOCN monomer were also detected. Tg was 115° C. (second heat, 10° C./min, N$_2$). The polymer made clear solutions when dissolved at 0.1 g/1 g of either hexafluorobenzene or Novec HFE-7500.

Rolling a 0.1 g sample of poly(8-CNVE/EVEOCN/PDD) with 1 g of Novec HFE-7500 gave a clear solution, which was spotted on a glass microscope slide and air-dried to a film. The microscope slide, while in a quartz box under N$_2$, was irradiated using a Rayonet Photochemical Reactor bulb. After 70.5 hr, a 0.021 g sample of film fragments showed no sign of solution or swelling with 1 g of Novec HFE-7500.

Example 10

Very Fast Photocrosslinking of Poly(EVE/E), Poly(EVE/VF2), and Poly(EVE/TFE)

Lumps of poly(EVE/E), poly(EVE/VF2), and poly(EVE/TFE) weighing from ~0.2 to 0.4 g were spread on glass microscope slides by heating for 1 hr in a 120° C. oven.

The thick films were exposed to very high intensity UV light using a PulseForge™ flash lamp (NovaCentrix, Austin, Tex.). The exposures consisted of sixteen 80 microsecond exposures at increasingly high intensity, followed by 20 to 40 additional exposures at the highest intensity, each exposure lasting for 80 microseconds. After a total exposure time of 0.028 sec, the poly(EVE/E) broke into fragments (rather than dissolving) when rolled in 2-heptanone. After a total exposure time of 0.044 sec, the poly(VF2/EVE) swelled in 2-heptanone with a 92% weight gain when rolled with 2-heptanone. After a total exposure time of 0.028 sec, the poly(EVE/TFE) became a soft viscous gel rather than dissolving when rolled with hexafluorobenzene.

Example 11

Preparation of Photocrosslinked Viton® Films

Viton® GAL200-S (DuPont) was dissolved in propyl acetate to make a 9.96 weight % solution. To 25 g of this solution were added 0.125 g of triallyl isocyanurate (TAIC, Aldrich) and 0.125 g of photoinitiator Irgacure® 651 (Ciba). The ingredients were stirred until a homogeneous solution was obtained. The solution was then filtered through a 0.45 micron PTFE syringe filter and some solvent evaporated using a rotary evaporator at room temperature to reduce the volume by 50% yielding a viscous liquid. Films were cast on microscope slides using this solution and, after air drying, they were crosslinked at 60° C. under nitrogen atmosphere using a Blak-Ray® B-100AP lamp (UVP, LLC. Upland, Calif.) for 15 minutes at 24 mW/cm$^2$ at 365 nm.

The index of refraction at D-line was 1.38 and the induced absorbance rate was less than or equal to 0 Abs/cm/(GJ/m$^2$)) at 3.8 kW/m$^2$ and was less than or equal to 0 at an irradiance of 52 kW/m$^2$.

Example 12

Un-Mirrored Optical Element Configured for Total Internal Reflection (TIR)

A ray-tracing model (TracePro, version 7.0. Lambda Research, Littleton Mass.) using a Windows-based PC simulates the performance of a plano-piano structure having a body (42, FIG. 1) with an array of totally-reflecting triangular groove inclusions (50) configured with the apex of the inclusions pointing toward a light source directing light toward the light incident surface (46A). The base of each inclusion is centered over one of the conductor lines (22A) typically affixed to the surface (20A) of a photovoltaic cell (20). The right-half of FIG. 1 depicts a cross-sectional view of the structure of the model showing one inclusion (50) over one of the conductor lines (22B). The conducting lines under the inclusions are 12 microns wide (g), while the repeat period (i.e., pitch p) of both the groove inclusions and conductor lines is 150 microns. The groove inclusions are fabricated into an FEP-polymer body (42) of thickness 125 microns (40T) and refractive index 1.34 (n$_C$), while the inclusions themselves have an essentially triangular cross-section, with a base width of 26 microns (b), a height of 63 microns (h), and are filled with air of refractive index 1 (n$_I$). Due to expected limitations of fabrication, the apex of each inclusion is taken to be rounded to a diameter of 1 micron (not shown in FIG. 1) rather than be perfectly sharp. The apex angle α is approximately 22.6°.

The FEP body (42) is adhered to the surface (24) of the photovoltaic cell by a silicone bonding layer (30) of thickness 12.5 microns (t) and refractive index 1.4 (n$_A$). (Care must be taken to prevent silicone from backfilling the inclusions, thereby displacing the air and eliminating the index contrast required for total internal reflection.) Light rays are introduced into the model simulating the range of incidence angles expected under the focused solar illumination characteristic of a concentrating photovoltaic system (angle β$_{Max}$ approximately 33°). The obscuration ratio g/p=12/150=8% represents the fraction of incident light that is typically lost to the conductor lines. But when inclusions are present rays that would otherwise strike the conductor lines and be lost, are instead deflected via total internal reflection from the surface of the inclusions and thereby reach the cell surface without retro-reflection where they produce electric power. Compared to the conventional case with no inclusions, the ray-trace model predicts that the totally-reflecting inclusions recover approximately 96% of the 8% light power that is otherwise lost to the conductor lines.

Example 13

Mirrored Optical Element

A ray-tracing model simulates the performance of the plano-piano structure identical to that analyzed in Example 12, except that the interior surfaces of each inclusion (48, left half of FIG. 1) covering one of the conductor lines (22A) are coated with 50 nanometers of metallic silver (48A, 48B) to produce mirrors which are 95% reflective to light impinging from above. In this example the silicone bonding layer (30) of thickness 12.5 microns (t) and refractive index 1.4 ($n_A$) is backfilled into the inclusions to seal the silver surfaces from atmospheric exposure and degradation. Light rays are introduced into the model simulating the same range of incidence angles as in Example 12. The obscuration ratio g/p=12/150=8% represents the fraction of incident light that is typically lost to the conductor lines. But when mirrored inclusions are present, rays that would otherwise strike the conductor lines and be lost, are instead deflected via reflection from the mirrored surfaces and thereby reach the cell surface without retro-reflection where they produce electric power. Compared to the conventional case with no inclusions, the ray-trace model predicts that the mirrored inclusions recover approximately 80% of the 8% light power that is otherwise lost to the conductor lines.

Those skilled in the art, having the benefits of the teachings of the present invention may effect numerous modifications thereto. It should be understood that such modifications lie within the contemplation of the present invention, as defined in the appended claims.

What is claimed is:
1. As an article of manufacture, an optical element comprising:
  a body having first and second opposed, substantially planar, major surfaces thereon, the first surface defining a light incident surface, the second surface defining a light output surface,
  the light output surface having a plurality of grooves formed therein, each groove having a mouth opening on the light output surface, the mouth having a predetermined width dimension "b" measured in the plane of the light output surface,
  each groove having opposed, substantially planar boundary walls that extend into the body and terminate therewithin at a closed apex, the closed apex having an included apex angle α,
  the optical element being improved in that it is operative to collect light incident upon the light incident surface thereof at an incident angle β up to a maximum operating angle $β_{Max}$ measured with respect to a normal to the incident surface and to convey that light to the light output surface without retro-reflection toward the incident surface,
  the improved optical element being characterized in that:
    the body is formed from a material having an index of refraction $n_C$ of at least 1.3 and an induced absorbance rate ΔAbs/Dose less than or equal to about 0.4, and wherein
    the angle α is defined in accordance with the relationship:

$$\alpha \leq \alpha_{Retro} = 60° - \frac{2}{3}\sin^{-1}\left(\frac{\sin\beta_{Max}}{n_C}\right)$$

for any maximum operating angle $β_{Max}$ within the range from about 1°<$β_{Max}$<90°.

2. As an article of manufacture, an optical element comprising:
  a body having first and second opposed, substantially planar, major surfaces thereon, the first surface defining a light incident surface, the second surface defining a light output surface,
  the light output surface having a plurality of grooves formed therein, each groove having a mouth opening on the light output surface, the mouth having a predetermined width dimension "b" measured in the plane of the light output surface,
  each groove having opposed, substantially planar boundary walls that extend into the body and terminate therewithin at a closed apex, the closed apex having an included apex angle α,
  the optical element being improved in that it is operative to collect light incident upon the light incident surface thereof at an incident angle β up to a maximum operating angle $β_{Max}$ measured with respect to a normal to the incident surface and to convey that light to the light output surface by the mechanism of total internal reflection from the boundary walls of the grooves present within the body of the optical element,
  the improved optical element being characterized in that:
    the body is formed from a material having an index of refraction $n_C$ of at least 1.3 and an induced absorbance rate ΔAbs/Dose less than or equal to about 0.4, and wherein
    each groove is filled with a material having an index of refraction $n_I$ at least equal to 1, and wherein
    the apex angle α is defined in accordance with the relationship:

$$\alpha \leq \alpha_{TIR} = 2\cos^{-1}\left(\frac{\sin\beta_{Max}}{n_C}\right) - 2\sin^{-1}\left(\frac{n_I}{n_C}\right)$$

for any maximum operating angle $β_{Max}$ chosen from the range from $$\text{about } 1° < \beta_{Max} < \begin{cases} \sin^{-1}\sqrt{n_C^2 - n_I^2} & \left(\sqrt{n_C^2 - n_I^2} \leq 1\right) \\ 90° & \left(\sqrt{n_C^2 - n_I^2} > 1\right) \end{cases}.$$

3. As an article of manufacture, an optical element comprising:
  a body having first and second opposed, substantially planar, major surfaces thereon, the first surface defining a light incident surface, the second surface defining a light output surface,
  the light output surface having a plurality of grooves formed therein, each groove having a mouth opening on the light output surface, the mouth having a predetermined width dimension "b" measured in the plane of the light output surface,
  each groove having opposed, substantially planar boundary walls that extend into the body and terminate therewithin at a closed apex, the closed apex having an included apex angle α, the optical element being improved in that it is operative to collect light incident upon the light incident surface thereof at an incident angle β up to a maximum operating angle $β_{Max}$ measured with respect to a normal to the incident surface and to convey that light to the light output surface without retro-reflection toward the incident surface and also by the mechanism of total internal reflection from the boundary walls of the grooves present within the body of the optical element, the improved optical element being characterized in that:
the body is formed from a material having an index of refraction $n_C$ of at least 1.3 and an induced absorbance rate ΔAbs/Dose less than or equal to about 0.4,
each groove is filled with a material having an index of refraction $n_I$ at least equal to 1, and wherein
the apex angle α is the smaller of the angles defined in accordance with the following relationships:

$$\alpha \leq \begin{cases} \alpha_{Retro} = 60° - \frac{2}{3}\sin^{-1}\left(\frac{\sin\beta_{Max}}{n_C}\right) \\ \alpha_{TIR} = 2\cos^{-1}\left(\frac{\sin\beta_{Max}}{n_C}\right) - 2\sin^{-1}\left(\frac{n_I}{n_C}\right) \end{cases}$$

for any maximum operating angle $β_{Max}$ chosen from the range from $$\text{about } 1° < \beta_{Max} < \begin{cases} \sin^{-1}\sqrt{n_C^2 - n_I^2} & \left(\sqrt{n_C^2 - n_I^2} \leq 1\right) \\ 90° & \left(\sqrt{n_C^2 - n_I^2} > 1\right) \end{cases}.$$

4. As an article of manufacture, an optical element comprising:
a body having first and second opposed, substantially planar, major surfaces thereon, the first surface defining a light incident surface, the second surface defining a light output surface,
the light output surface having a plurality of grooves formed therein, each groove having a mouth opening on the light output surface, the mouth having a predetermined width dimension "b" measured in the plane of the light output surface,
each groove having opposed, substantially planar boundary walls that extend into the body and terminate therewithin at a closed apex, the closed apex having an included apex angle α,
the optical element being improved in that it is operative to collect light incident upon the light incident surface thereof at an incident angle β up to a maximum operating angle $β_{Max}$ measured with respect to a normal to the incident surface and to convey that light to the light output surface without retro-reflection toward the incident surface,
the improved optical element being characterized in that:
the body is formed from a material having an index of refraction $n_C$ of at least 1.3 and an induced absorbance rate ΔAbs/Dose less than or equal to about 0.4, and wherein
the planar boundary walls of the grooves are coated with a reflective material, and wherein
the angle α is defined in accordance with the relationship:

$$\alpha \leq \alpha_{Retro} = 60° - \frac{2}{3}\sin^{-1}\left(\frac{\sin\beta_{Max}}{n_C}\right)$$

for any maximum operating angle $β_{Max}$ within the range from about 1°<$β_{Max}$<90°.

5. The optical element of any of claim 1, 2, 3 or 4 wherein the body is formed of a fluoropolymer material.

6. The optical element of any of claim 1, 2, 3 or 4 wherein the body is formed of a material having an induced absorbance rate ΔAbs/Dose less than or equal to about 0.2.

7. The optical element of any of claim 1, 2, 3 or 4 wherein the body is formed of a material having an index of refraction $n_C$ in the range from about 1.33 to about 1.75.

* * * * *